(12) United States Patent
Cui et al.

(10) Patent No.: US 12,183,987 B2
(45) Date of Patent: Dec. 31, 2024

(54) PHASE SHIFTER, METHOD FOR MANUFACTURING SAME, AND ELECTRONIC DEVICE

(71) Applicant: BOE Technology Group Co., Ltd., Beijing (CN)

(72) Inventors: Zhao Cui, Beijing (CN); Zhonglan Zhao, Beijing (CN); Feng Zhang, Beijing (CN); Liwen Dong, Beijing (CN); Dongfei Hou, Beijing (CN); Yuqiao Li, Beijing (CN); Wenqu Liu, Beijing (CN); Zhijun Lv, Beijing (CN); Detian Meng, Beijing (CN); Liuqing Li, Beijing (CN); Yong Ma, Beijing (CN); Mengya Song, Beijing (CN); Feng Qu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/024,022

(22) PCT Filed: May 10, 2022

(86) PCT No.: PCT/CN2022/092027
§ 371 (c)(1),
(2) Date: Feb. 28, 2023

(87) PCT Pub. No.: WO2023/216111
PCT Pub. Date: Nov. 16, 2023

(65) Prior Publication Data
US 2024/0283150 A1    Aug. 22, 2024

(51) Int. Cl.
*H01Q 3/36* (2006.01)
*H01Q 1/02* (2006.01)

(52) U.S. Cl.
CPC ............... *H01Q 3/36* (2013.01); *H01Q 1/02* (2013.01)

(58) Field of Classification Search
CPC .................................. H01Q 3/36; H01Q 1/02
See application file for complete search history.

(56) References Cited

U.S. PATENT DOCUMENTS

2022/0021102 A1* 1/2022 Hasegawa ............ H01Q 1/2283

FOREIGN PATENT DOCUMENTS

WO    WO-2019228213 A1 * 12/2019    ........... G02F 1/1313

\* cited by examiner

*Primary Examiner* — Daniel D Chang
(74) *Attorney, Agent, or Firm* — IPro, PLLC

(57) ABSTRACT

Provided are a phase shifter, a method for manufacturing the same, and an electronic device. The phase shifter includes: a first substrate and a second substrate that are oppositely arranged, and heat conduction structures arranged between the first substrate and the second substrate. Orthographic projections of the heat conduction structures and orthographic projections of phase shifting units on the same substrate do not overlap each other.

17 Claims, 7 Drawing Sheets

PHASE SHIFTER, METHOD FOR MANUFACTURING SAME, AND ELECTRONIC DEVICE

CROSS-REFERENCE TO RELATED APPLICATIONS

The disclosure is a National Stage of International Application No. PCT/CN2022/092027, filed on May 10, 2022, which is hereby incorporated by reference in their entireties.

FIELD

The present disclosure relates to the technical field of communication, and particularly to a phase shifter, a method for manufacturing the same, and an electronic device.

BACKGROUND

As the communication technology develops and the fifth generation (5G) technology has been gradually popularized in more application scenarios, hardware such as communication antennas are required to adapt to scenarios such as a great bandwidth, high reliability, a low delay and a big connection, so as to propagate electromagnetic wave signals more rapidly and reliably.

At present, the mainstream solution is to transmit the electromagnetic wave signals via phased array antennas, to transmit and receive signals between communication devices. The phased array antenna is a type of array antenna which can change a beam pointing direction of a directional diagram by controlling a feeding phase of a radiating element in the array antenna. A phased array is mainly aimed to implement spatial scanning (that is, electric scanning) of an array beam. As a vital device of the phased array antenna, a phase shifter plays a significant role in increasing power combining efficiency of antenna assemblies and combining efficiency of echo signals by changing phase congruency of the antenna assemblies, implementing beam switching or scanning, and enhancing a capability of a communication system. Therefore, it is extremely important to improve performance of the phase shifter.

SUMMARY

The present disclosure provides a phase shifter, a method for manufacturing the same, and an electronic device, which are used for avoiding the problem of overheating of the phase shifter.

In a first aspect, an embodiment of the present disclosure provides a phase shifter. The phase shifter includes:
a first substrate and a second substrate that are oppositely arranged, a plurality of phase shifting units arranged in an array between the first substrate and the second substrate, and one or more heat conduction structures arranged between the first substrate and the second substrate, where orthographic projections of the one or more heat conduction structures and orthographic projections of the phase shifting units on the same substrate do not overlap each other.

In a possible implementation mode, the one or more heat conduction structures are arranged between every two adjacent phase shifting units of at least part of the plurality of phase shifting units.

In a possible implementation mode, the one or more heat conduction structures are arranged on a side, close to the second substrate, of the first substrate; and/or the one or more heat conduction structures are arranged on a side, close to the first substrate, of the second substrate.

In a possible implementation mode, the heat conduction structures include first electrodes, a thermoelectric layer and second electrodes that are sequentially stacked on a corresponding substrate; and orthographic projections of the first electrodes of the heat conduction structures on the corresponding substrate completely fall within orthographic projections of the corresponding second electrodes on the corresponding substrate.

In a possible implementation mode, the phase shifting units include: a plurality of microstrip line electrodes located on the side, close to the second substrate, of the first substrate, and a plurality of ground electrodes located on the side, close to the first substrate, of the second substrate and corresponding to the microstrip line electrodes; orthographic projections of the microstrip line electrodes of the phase shifting units on the first substrate do not overlap each other; and orthographic projections of the ground electrodes of the phase shifting units on the second substrate do not overlap each other.

In a possible implementation mode, the second electrodes and the microstrip line electrodes that are located on the first substrate are manufactured on the same layer and insulated from each other.

In a possible implementation mode, the second electrodes and the ground electrodes that are located on the second substrate are manufactured on the same layer and insulated from each other.

In a possible implementation mode, the first electrodes located on the same substrate are connected in series via a wire and are grounded.

In a possible implementation mode, the thermoelectric layer corresponding to the heat conduction structures located on the same substrate is an entire layer structure.

In a possible implementation mode, the phase shifting units further include dielectric layers located between the plurality of microstrip line electrodes and the plurality of ground electrodes; and orthographic projections of the dielectric layers of the phase shifting units on the second substrate do not overlap each other.

In a possible implementation mode, at least one supporting post is arranged between every two adjacent phase shifting units of at least part of the plurality of phase shifting units.

In a second aspect, an embodiment of the present disclosure further provides an electronic device. The electric device includes: any one of the above phase shifters.

In a third aspect, an embodiment of the present disclosure further provides a method for manufacturing any one of the above phase shifters. The method includes: forming the one or more heat conduction structures between the first substrate and the second substrate while a plurality of phase shifting units arranged in an array are formed.

In a possible implementation mode, the forming the one or more heat conduction structures between the first substrate and the second substrate includes:
forming the one or more heat conduction structures between every two adjacent phase shifting units of at least part of the plurality of phase shifting units.

In a possible implementation mode, the forming the one or more heat conduction structure between every two adjacent phase shifting units of at least part of the plurality of phase shifting units includes:
forming the one or more heat conduction structures between every two adjacent phase shifting units of at least part of the plurality of phase shifting units on a side, close to the second substrate, of the first substrate; and/or forming the one or more heat conduction structures between every two adjacent phase shifting units of at least part of the plurality of phase shifting units on a side, close to the first substrate, of the second substrate.

In a possible implementation mode, the forming the one or more heat conduction structures between every two adjacent phase shifting units of at least part of the plurality of phase shifting units on the side, close to the second substrate, of the first substrate includes:

forming a pattern of a first electrode on the side, close to the second substrate, of the first substrate through a patterning process;

forming a thermoelectric layer on a side, facing away from the first substrate, of the first electrode;

forming a pattern of a second electrode on a side, facing away from the first electrode, of the thermoelectric layer; and forming the one or more heat conduction structures comprising the first electrode, the thermoelectric layer and the second electrode.

In a possible implementation mode, the forming the one or more heat conduction structures between every two adjacent phase shifting units of at least part of the plurality of phase shifting units on the side, close to the first substrate, of the second substrate includes:

forming a pattern of a first electrode on the side, close to the first substrate, of the second substrate through a patterning process;

forming a thermoelectric layer on a side, facing away from the second substrate, of the first electrode;

forming a pattern of a second electrode on a side, facing away from the first electrode, of the thermoelectric layer; and forming the one or more heat conduction structures comprising the first electrode, the thermoelectric layer and the second electrode.

DETAILED DESCRIPTION OF THE EMBODIMENTS

Figure 1:
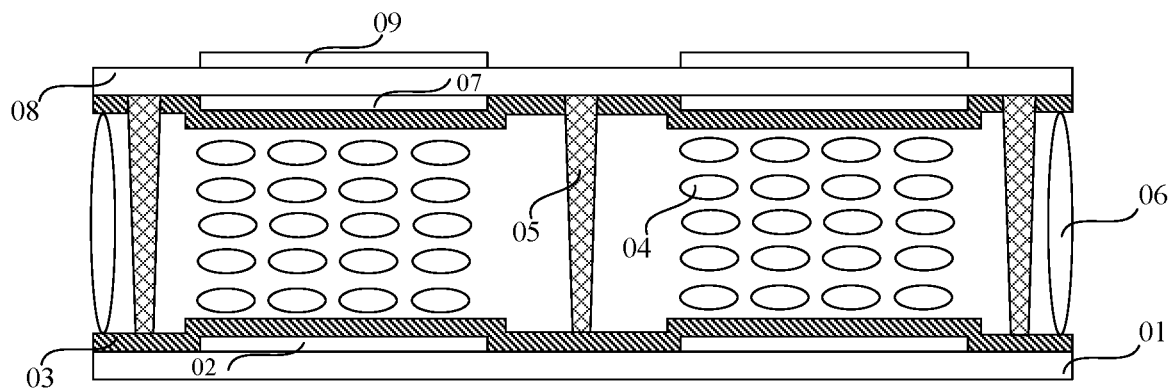
FIG. 1 is a schematic structural diagram of a liquid crystal antenna based on a liquid crystal phase shifter in the related art.

In order to make objectives, technical solutions and advantages of embodiments of the present disclosure clearer, the technical solutions of the present disclosure will be clearly and completely described below in combination with accompanying drawings in the embodiments of the present disclosure. Apparently, the described embodiments are merely some embodiments rather than all embodiments of the present disclosure. In addition, embodiments of the present disclosure and features in the embodiments can be combined with each other without conflict. On the basis of the described embodiments of the present disclosure, all other embodiments obtained by those of ordinary skill in the art without making creative efforts fall within the scope of protection of the present disclosure.

Unless otherwise defined, technical terms or scientific terms used in the present disclosure should have the ordinary meanings understood by those of ordinary skill in the art to which the present disclosure belongs. "Comprise", "include" or other similar words used in the present disclosure mean that an element or object appearing before the word contains elements or objects listed after the word and equivalents thereof, without excluding other elements or objects.

It should be noted that sizes and shapes of all figures in accompanying drawings do not reflect true scales and are merely intended to illustrate contents of the present disclosure. Moreover, the same or similar reference numerals denote the same or similar elements or elements having the same or similar functions throughout.

In the related art, there are mainly two types of phase shifters, that is, a mechanical phase shifter and an electronic phase shifter. The mechanical phase shifter has a fatal defect that it cannot rapidly change a phase in an extremely short time due to the constraint of inertia, but signal transmission in the 5G era requires a rapid change of a phase in millisecond or even a shorter time, and the mechanical phase shifter is large in size and heavy in weight. Although the electronic phase shifter overcomes the defect of the mechanical phase shifter, the electronic phase shifter is over high in cost, complex in design, and poor in intermodulation performance, and cannot continuously modulate a phase.

A liquid crystal phase shifter has characteristics that voltages are loaded on an upper base plate and a lower base plate containing liquid crystals to form overlapping capacitance, so as to change a dielectric constant of a liquid crystal material, so that, a phase constant of an electromagnetic wave on a device is changed, and finally the phase shift quantity is adjusted, thereby implementing beam scanning of a phased array antenna device. FIG. 1 is a schematic structural diagram of a liquid crystal antenna based on a liquid crystal phase shifter in the related art, where 01 denotes a lower base plate, 02 denotes a ground electrode, 03 denotes a polyimide (PI) layer, 04 denotes a liquid crystal, 05 denotes a supporting post, 06 denotes a sealant, 07 denotes a microstrip line electrode, 08 denotes an upper base plate, and 09 denotes a transceiver electrode.

The liquid crystal phase shifter not only overcomes the defects of a large size, a heavy weight and the incapability to rapidly change a phase in an extremely short time of the mechanical phase shifter, but also overcomes the defects of poor intermodulation performance and the incapability to continuously modulate a phase of the electronic phase shifter. In addition, the liquid crystal phase shifter is simple in manufacturing process, small in size, light in weight, and low in cost.

However, when an electromagnetic wave propagates in the liquid crystal phase shifter, the certain loss may occur, which is mainly divided into dielectric loss and transmission loss, and the loss may be converted into heat energy in the liquid crystal phase shifter. With the extension of service time, heat increases, and a temperature sharply rises. As a type of temperature sensitive material, when the temperature rises to a certain range, the liquid crystal may become a pure liquid and lose performance of the liquid crystal, and finally the liquid crystal phase shifter may lose a phase shifting function. Moreover, a power capacity of an existing liquid crystal phase shifter is 20 W, and an effective temperature range of the liquid crystal used in the liquid crystal phase shifter is −20° C.-157° C. Under the condition of power capacity of 20 W, after the liquid crystal phase shifter works for 2 h, a working temperature rises to about 200° C. to lose an effect of a liquid crystal. Therefore, in order to increase the power capacity of the liquid crystal phase shifter, it is urgent to solve the heat dissipation problem of the liquid crystal phase shifter.

In view of this, embodiments of the present disclosure provide a phase shifter, a method for manufacturing the same, and an electronic device, which are used for avoiding the problem of overheating of the phase shifter.

Figure 2:
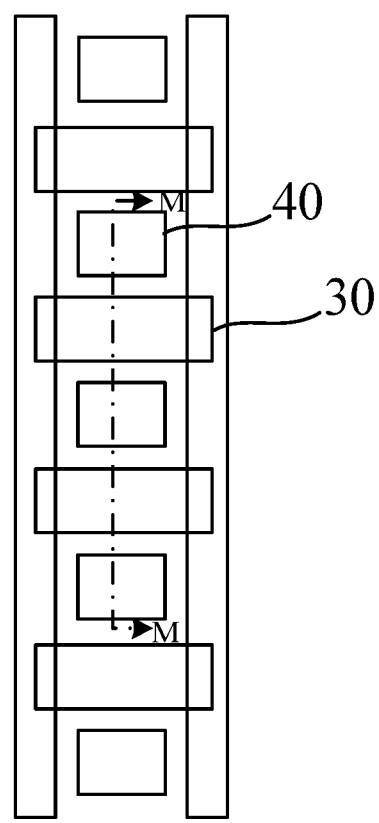
FIG. 2 is a partial schematic diagram of planar distribution of a phase shifter according to an embodiment of the present disclosure.
Figure 3:
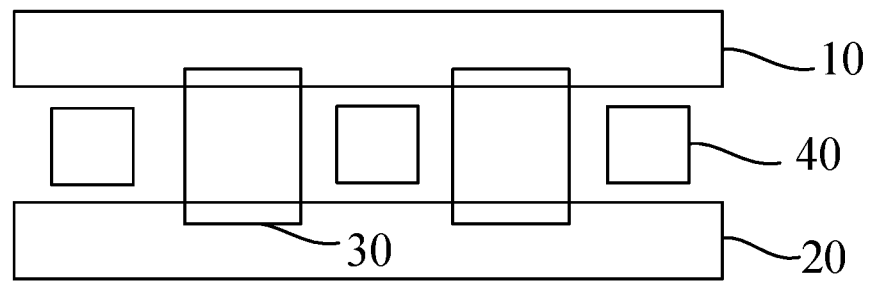
FIG. 3 is a schematic diagram of a sectional structure in a direction MM in FIG. 2.

As shown in FIGS. 2 and 3, the present disclosure provides a phase shifter, FIG. 2 shows a partial schematic diagram of planar distribution of a phase shifter, and FIG. 3 shows a schematic diagram of a sectional structure in a direction MM in FIG. 2. Specifically, the phase shifter includes:

a first substrate 10 and a second substrate 20 that are oppositely arranged, a plurality of phase shifting units 30 arranged in an array between the first substrate 10 and the second substrate 20, and heat conduction structures 40 arranged between the first substrate 10 and the second substrate 20, where orthographic projections of the heat conduction structures 40 and orthographic projections of the phase shifting units 30 on the same substrate do not overlap each other.

In an embodiment of the present disclosure, at least one heat conduction structure 40 is arranged between every two adjacent phase shifting units 30 of at least part of the plurality of phase shifting units 30. In one exemplary embodiment, at least one heat conduction structure 40 may be arranged between every two adjacent phase shifting units 30 in the plurality of phase shifting units 30, or between every two adjacent phase shifting units 30 of part of the plurality of phase shifting units 30.

In a specific implementation process, the phase shifter includes a plurality of phase shifting units 30 arranged in an array between the first substrate 10 and the second substrate 20, and the specific number of the phase shifting units 30 may be set according to actual application requirements, and is not limited herein. In addition, the phase shifter further includes heat conduction structures 40 arranged between the first substrate 10 and the second substrate 20, one or more heat conduction structures 40 may be arranged, and the specific number of the heat conduction structures 40 may be set according to actual application requirements. Moreover, orthographic projections of the heat conduction structures 40 and orthographic projections of the phase shifting units 30 on the same substrate do not overlap each other, thereby preventing the heat conduction structures 40 from affecting phase shifting performance of the phase shifting units 30 while ensuring that the heat conduction structures 40 conduct out heat generated by the phase shifter.

During specific implementation, at least one heat conduction structure 40 is arranged between every two adjacent phase shifting units 30 of at least part of the plurality of phase shifting units 30. It should be noted that one or more heat conduction structures 40 may be arranged between every two adjacent phase shifting units 30 of at least part of the plurality of phase shifting units 30. In this case, one or more heat conduction structures 40 may be arranged in the entire phase shifter. Certainly, the specific number of the heat conduction structures 40 may be set according to actual application requirements, and is not limited herein. In this way, the heat generated by the phase shifter may be conducted out by the one or more heat conduction structures 40, thereby avoiding overheating of the phase shifter and ensuring use performance of the phase shifter.

In embodiments of the present disclosure, the one or more heat conduction structures 40 are arranged on a side, close to the second substrate 20, of the first substrate 10; and/or the one or more heat conduction structures 40 are arranged on a side, close to the first substrate 10, of the second substrate 20.

In a specific implementation process, the one or more heat conduction structures 40 may be arranged according to implementation modes including but not limited to the following three implementation modes. The one or more heat conduction structures 40 may be arranged according to actual application requirements, which is not limited herein.

In a first implementation mode, the one or more heat conduction structures 40 are merely arranged on a side, close to the second substrate 20, of the first substrate 10. In this way, heat generated by the phase shifter may be conducted out by the one or more heat conduction structures 40 arranged on the first substrate 10, so as to ensure a heat dissipation function of the phase shifter, thereby avoiding overheating of the phase shifter.

In a second implementation mode, the one or more heat conduction structures 40 are merely arranged on a side, close to the first substrate 10, of the second substrate 20. In this way, heat generated by the phase shifter may be conducted out by the one or more heat conduction structures 40 arranged on the second substrate 20, so as to ensure a heat dissipation function of the phase shifter, thereby avoiding overheating of the phase shifter.

In a third implementation mode, the one or more heat conduction structures 40 are not only arranged on a side, close to the second substrate 20, of the first substrate 10, but also on a side, close to the first substrate 10, of the second substrate. That is to say, there are one or more heat conduction structures 40 on the side, close to the second substrate 20, of the first substrate 10, and one or more heat conduction structures 40 on the side, close to the first substrate 10, of the second substrate 20. In this way, heat generated by the phase shifter may be conducted out by the heat conduction structures 40 arranged on the first substrate 10 and the second substrate 20, so as to increase heat dissipation efficiency of the heat conduction structures 40 for the phase shifter.

In embodiments of the present disclosure, the heat conduction structures 40 include first electrodes 401, a thermoelectric layer 403 and second electrodes 402 that are sequentially stacked on a corresponding substrate; and orthographic projections of the first electrodes 401 of the heat conduction structures 40 on the corresponding substrate completely fall within orthographic projections of the corresponding second electrodes 402 on the corresponding substrate.

In a specific implementation process, each heat conduction structure 40 includes a first electrode 401, a thermoelectric layer 403 and a second electrode 402 that are sequentially stacked on a corresponding substrate, and the thermoelectric layer 403 is a film layer for converting heat energy into electrical signals. In an exemplary embodiment, the material of the thermoelectric layer 403 may be polyvinylidene fluoride (PVDF). In addition, the materials of the thermoelectric layer 403 may also be ferroelectric, semiconductor metal alloy and the polymer thermoelectric material. Certainly, the specific material of the thermoelectric layer 403 may be selected according to actual application requirements, and is not limited herein. In this way, the thermoelectric layer 403 may convert heat energy into electrical signals; and under the action of the first electrodes 401, the thermoelectric layer 403 and the second electrodes 402 that are stacked, heat generated by the phase shifter may be effectively conducted out, so as to avoid overheating of the phase shifter. In addition, orthographic projections of the first electrodes 401 of the heat conduction structures 40 on the corresponding substrate completely fall within orthographic projections of the corresponding second electrodes 402 on the corresponding substrate, thereby ensuring thermoelectric conversion efficiency and heat conduction efficiency, and improving use performance of the phase shifter.

In embodiments of the present disclosure, the phase shifting units 30 include: microstrip line electrodes 301 located on the side, close to the second substrate 20, of the first substrate 10, and ground electrodes 302 located on the side, close to the first substrate 10, of the second substrate 20 and corresponding to the microstrip line electrodes 301; and orthographic projections of the microstrip line electrodes 301 of the phase shifting units 30 on the first substrate 10 do not overlap each other, and orthographic projections of the ground electrodes 302 of the phase shifting units 30 on the second substrate 20 do not overlap each other.

In a specific implementation process, each phase shifting unit 30 includes a microstrip line electrode 301 located on the side, close to the second substrate 20, of the first substrate 10, and a ground electrode 302 located on the side, close to the first substrate 10, of the second substrate 20 and corresponding to the microstrip line electrode 301. In this way, a voltage is loaded to the microstrip line electrode 301 and the ground electrode 302 to form overlapping capacitance, thereby changing a dielectric constant of a material between the microstrip line electrode 301 and the ground electrodes 302. In this case, a phase constant of an electromagnetic wave on the phase shifter may change, so as to adjust a phase shift degree. In addition, orthographic projections of the microstrip line electrodes 301 of the phase shifting units 30 on the first substrate 10 do not overlap each other, and orthographic projections of the ground electrodes 302 of the phase shifting units 30 on the second substrate 20 do not overlap each other. Therefore, mutual independence of the phase shifting units 30 is ensured, and use performance of the phase shifter is ensured.

In embodiments of the present disclosure, the second electrodes 402 and the microstrip line electrodes 301 that are located on the first substrate 10 are manufactured on the same layer and insulated from each other.

In a specific implementation process, the second electrodes 402 and the microstrip line electrodes 301 that are located on the first substrate 10 are manufactured on the same layer. In this way, a manufacturing process for the heat conduction structures 40 on the first substrate 10 is simplified, and manufacturing efficiency of the phase shifter is increased. Moreover, the second electrodes 402 and the microstrip line electrodes 301 that are located on the first substrate 10 are insulated from each other, thereby ensuring phase shifting performance of the phase shifting units 30 while ensuring heat conduction performance of the heat conduction structures 40.

In embodiments of the present disclosure, the second electrodes 402 and the ground electrodes 302 that are located on the second substrate 20 are manufactured on the same layer and insulated from each other. The second electrodes 402 and the ground electrodes 302 that are located on the second substrate 20 are manufactured on the same layer, thereby simplifying a manufacturing process for the heat conduction structures 40 on the second substrate 20 and increasing manufacturing efficiency of the phase shifter. Moreover, the second electrodes 402 and the ground electrodes 302 that are located on the second substrate 20 are manufactured on the same layer, thereby ensuring phase shifting performance of the phase shifting units 30 while ensuring heat conduction performance of the heat conduction structures 40.

In embodiments of the present disclosure, the first electrodes 401 located on the same substrate are connected in series via a wire and are grounded.

In a specific implementation process, each first electrode 401 may be designed in a block shape, and the first electrodes 401 located on the same substrate may be connected in series via a wire and are grounded, thereby increasing heat conduction efficiency of the heat conduction structures 40 on the same substrate.

In embodiments of the present disclosure, the thermoelectric layer 403 corresponding to the heat conduction structures 40 located on the same substrate is an entire layer structure. In this way, a total area of the thermoelectric layer 403 is increased, and thermoelectric conversion efficiency of the thermoelectric layer 403 in the heat conduction structures 40 is ensured.

In embodiments of the present disclosure, the phase shifting units 30 further include dielectric layers 303 located between the plurality of microstrip line electrodes 301 and the plurality of ground electrodes 302, and orthographic projections of the dielectric layers 303 of the phase shifting units 30 on the second substrate 20 do not overlap each other.

In a specific implementation process, the phase shifting units 30 further include dielectric layers 303 located between the plurality of microstrip line electrodes 301 and the plurality of ground electrodes 302. In an exemplary embodiment, the dielectric layers 303 may be liquid crystal layers, and the corresponding phase shifter is a liquid crystal phase shifter. Moreover, orthographic projections of the dielectric layers 303 of the phase shifting units 30 on the second substrate 20 do not overlap each other. In this way, independence among the phase shifting units 30 is ensured, mutual interference among the phase shifting units 30 is avoided, and use performance of the phase shifter is improved.

In embodiments of the present disclosure, at least one supporting post is arranged between every two adjacent phase shifting units 30 of at least part of the plurality of phase shifting units 30. In this way, alignment performance between the first substrate 10 and the second substrate 20 is ensured via the supporting posts. It should be noted that more supporting posts may be arranged between every two adjacent phase shifting units 30 of at least part of the plurality of phase shifting units 30. The specific number of the supporting posts may be set according to actual application requirements, and is not limited herein.

It should be noted that in addition to the above related film layers, the phase shifter may be further provided with a passivation layer for ensuring insulation between adjacent electrodes; and the phase shifter may be provided with an alignment layer 70 on a side, close to the first substrate 10, of a liquid crystal layer, and provided with an alignment layer 70 on a side, close to the second substrate 20, of the liquid crystal layer. In an exemplary embodiment, the alignment layer 70 may be a polyimide (PI) film. The material of the passivation layer may be silicon nitride (SiN) or silicon oxide (SiO), which is not limited herein. Liquid crystal molecules in the liquid crystal layer are inclined at a preset angle through the pre-arranged alignment layers 70. In this case, after voltages are loaded to the microstrip line electrodes 301 and the ground electrodes 302, adjustment efficiency of a dielectric constant of the liquid crystal layer is increased, thereby increasing phase shift efficiency. Certainly, other film layers of the phase shifter may be arranged according to actual application requirements, and reference may be made to specific arrangements in the related art for details, which is not described in detail herein.

The phase shifter structure in the present disclosure will be explained below in combination with specific implementation modes. It should be noted that in the case that a base plate on which the first substrate 10 is located is an upper base plate, a base plate on which the second substrate 20 is located is a lower base plate; and in the case that a base plate on which the first substrate 10 is located is a lower base plate, a base plate on which the second substrate 20 is located is an upper base plate. Unless otherwise specified, A in the figure denotes a planar distribution diagram of an upper base plate, B denotes a planar distribution diagram of a lower base plate, A&B denotes a planar distribution diagram in which the upper base plate A and the lower base plate B are bonded together, and the dielectric layers 303 are liquid crystal layers.

Figure 4:
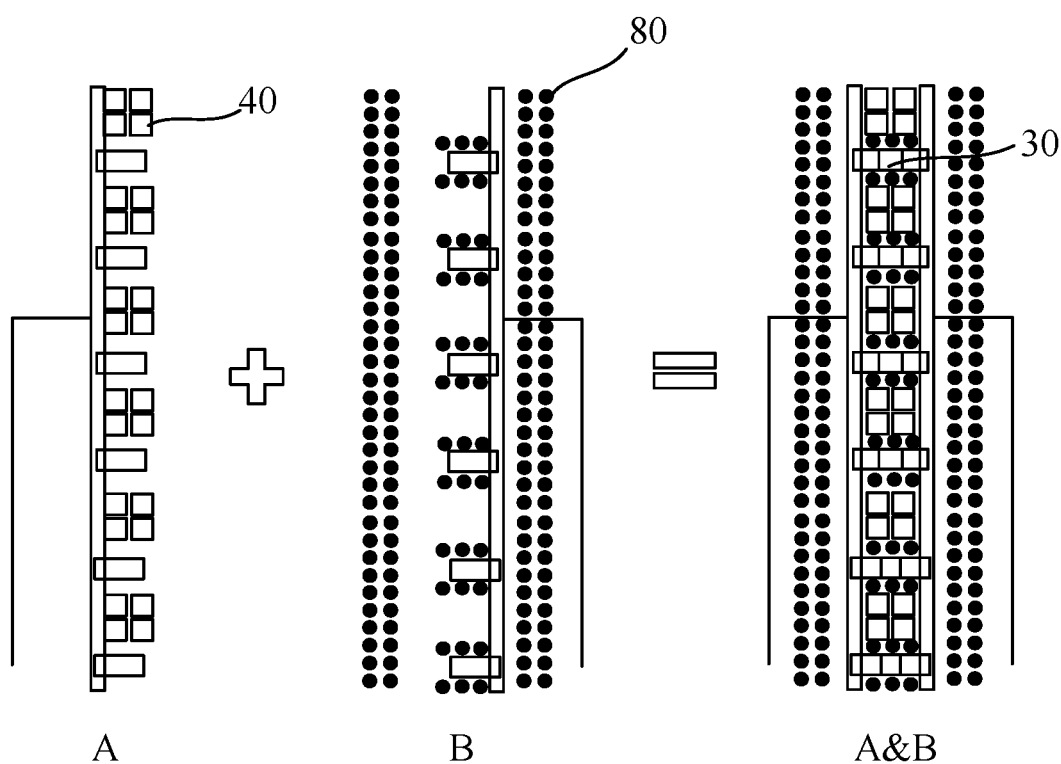
FIG. 4 is a schematic diagram of planar distribution of a first implementation mode of a phase shifter according to an embodiment of the present disclosure.
Figure 5:
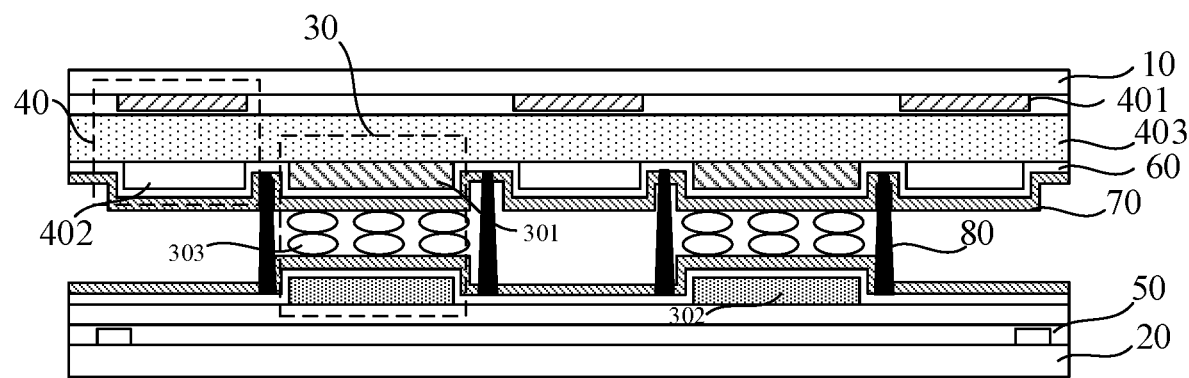
FIG. 5 is a schematic diagram of a sectional structure of a phase shifter in the first implementation mode of the phase shifter according to an embodiment of the present disclosure.

The first implementation mode is as shown in FIGS. 4 and 5, FIG. 4 shows a schematic diagram of planar distribution of a phase shifter, and FIG. 5 shows a schematic diagram of a sectional structure of a phase shifter. In the first implementation mode, the heat conduction structures 40 are merely arranged on a side, close to the second substrate 20, of the first substrate 10.

Figure 6:
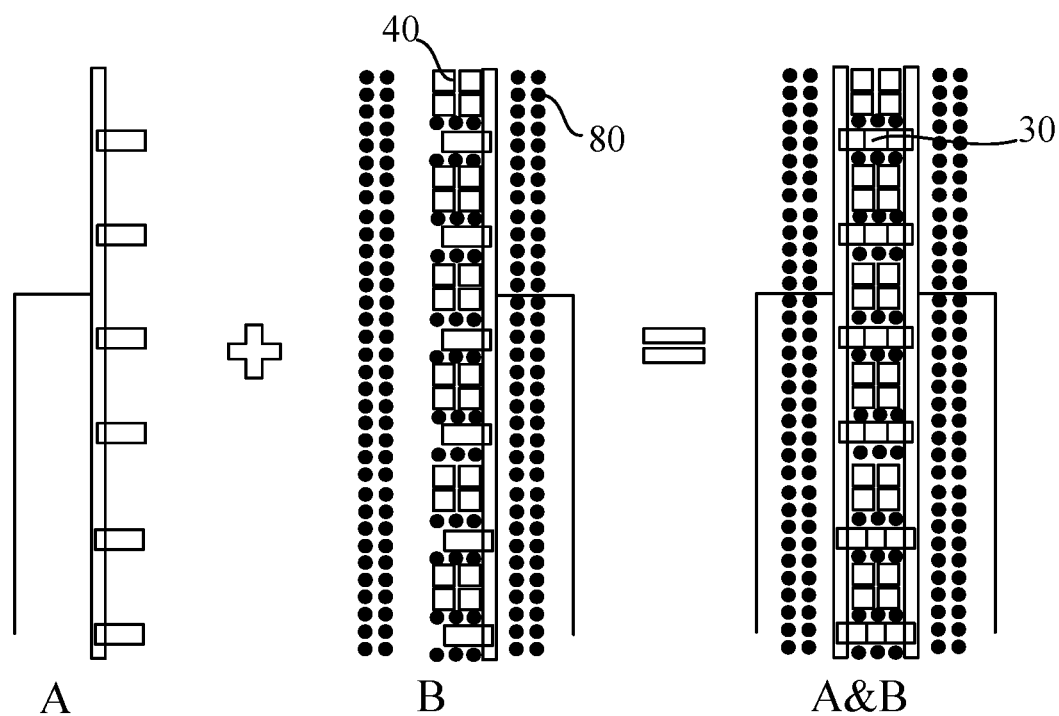
FIG. 6 is a schematic diagram of planar distribution of a second implementation mode of a phase shifter according to an embodiment of the present disclosure.
Figure 7:
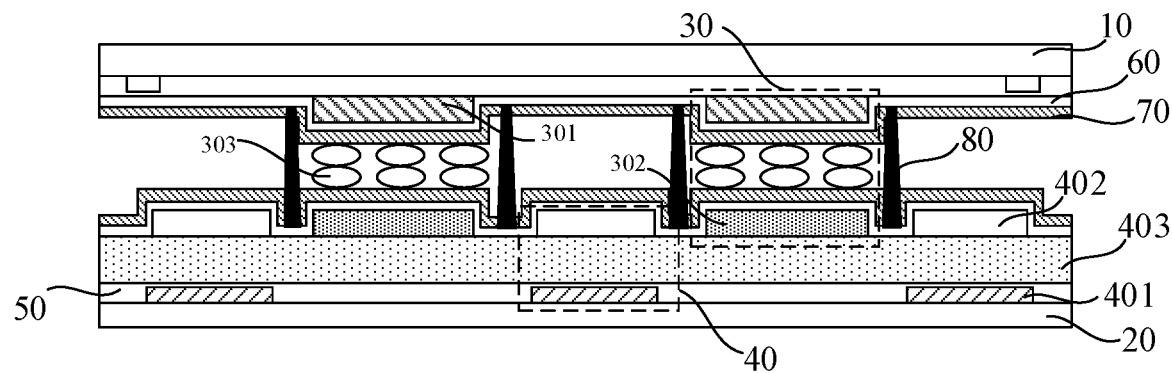
FIG. 7 is a schematic diagram of a sectional structure of a phase shifter in the second implementation mode of the phase shifter according to an embodiment of the present disclosure.

The second implementation mode is as shown in FIGS. 6 and 7, FIG. 6 shows a schematic diagram of planar distribution of a phase shifter, and FIG. 7 shows a schematic diagram of a sectional structure of a phase shifter. In the second implementation mode, the heat conduction structures 40 are merely arranged on a side, close to the first substrate 10, of the second substrate 20.

Figure 8:
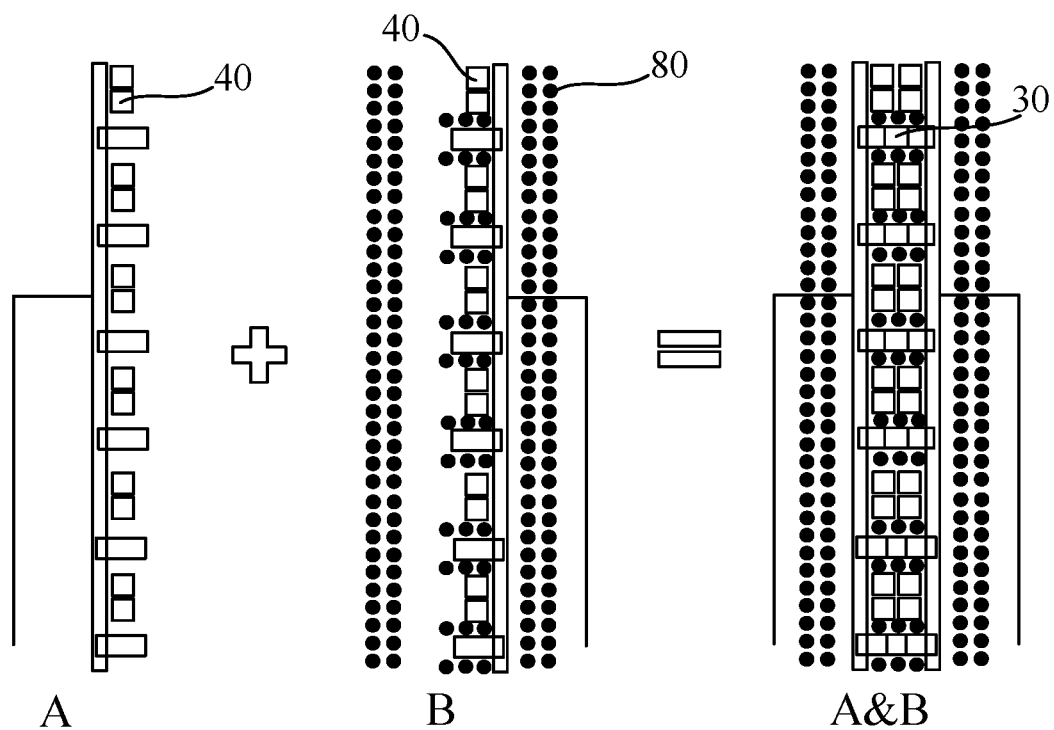
FIG. 8 is a schematic diagram of planar distribution of a third implementation mode of a phase shifter according to an embodiment of the present disclosure.
Figure 9:
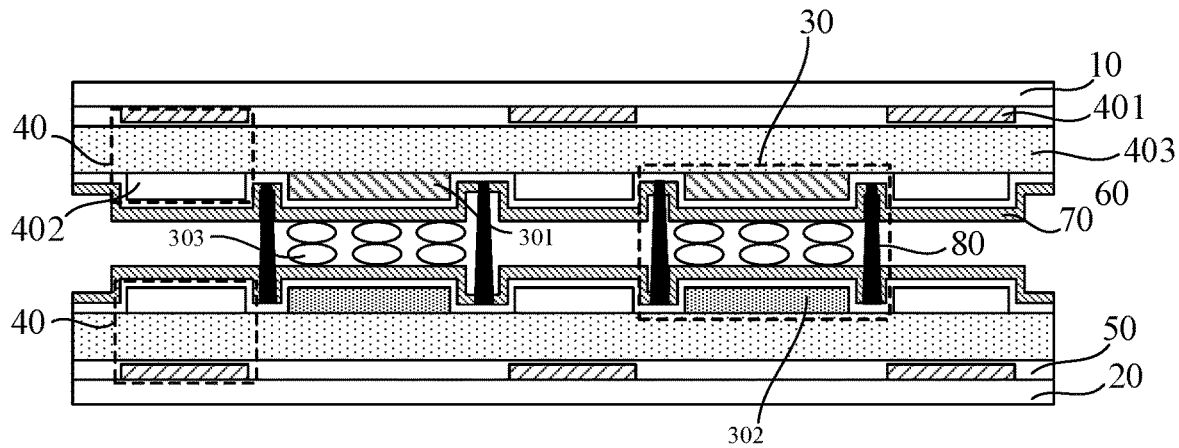
FIG. 9 is a schematic diagram of a sectional structure of a phase shifter in a third implementation mode of the phase shifter according to an embodiment of the present disclosure.

The third implementation mode is shown in FIGS. 8 and 9, FIG. 8 shows a schematic diagram of planar distribution of a phase shifter, and FIG. 9 shows a schematic diagram of a sectional structure of a phase shifter.

Certainly, during practical application, besides the above three implementation modes, the phase shifter may be designed through other implementation modes according to requirements in combination with the same concept of the present disclosure, which is not limited herein.

Based on the same disclosed concept, embodiments of the present disclosure further provide a phased array antenna, and the phased array antenna includes a plurality of antenna array elements and any one of the above phase shifters for adjusting phases of the antenna array elements.

Embodiments of the present disclosure further provide an electronic device, and the electronic device includes any one of the above phase shifters. Moreover, the electronic device further includes the above phased array antenna. In addition, the phase shifter includes a plurality of phase shifting units 30 arranged in an array, and after voltages are applied to the phase shifting units 30 to form an electric field, the liquid crystal layer is driven to deflect, thereby changing a dielectric constant of the liquid crystal layer and changing a phase of an electromagnetic wave signal. It should be noted that phase shift quantities required to be adjusted of the phase shifting units 30 may be the same, or may be different, and corresponding voltages may be applied to the phase shifting units 30 according to actual application requirements, so that the whole process of adjusting phase shift quantities is more convenient and faster.

In a specific implementation process, the principle of solving the problem by the electronic device is similar to that of the above phase shifter, such that for implementation of the electronic device, reference may be made to implementation of the above phase shifter, and repetitions will not be described. In a specific implementation process, the electronic device provided in embodiments of the present disclosure may be any product or component having an antenna function, such as a mobile phone, a tablet computer, a television, a display, a notebook computer, a digital photo frame and a navigator. Other essential components of the electronic device would be understood by those of ordinary skill in the art and will not be repeated herein, and should not be regarded as a limitation to the present disclosure.

Based on the same disclosed concept, embodiments of the present disclosure further provide a method for manufacturing the above phase shifter. The manufacturing method includes: forming one or more heat conduction structures between the first substrate and the second substrate while a plurality of phase shifting units arranged in an array are formed.

In an embodiment of the present disclosure, the step of forming the one or more heat conduction structures between the first substrate and the second substrate includes: forming the one or more heat conduction structures between every two adjacent phase shifting units of at least part of the plurality of phase shifting units.

In an embodiment of the present disclosure, the step of forming the one or more heat conduction structures between every two adjacent phase shifting units of at least part of the plurality of phase shifting units includes:

forming the one or more heat conduction structures between every two adjacent phase shifting units of at least part of the plurality of phase shifting units on a side, close to the second substrate, of the first substrate; and/or forming the one or more heat conduction structures between every two adjacent phase shifting units of at least part of the plurality of phase shifting units on a side, close to the first substrate, of the second substrate.

Figure 10:
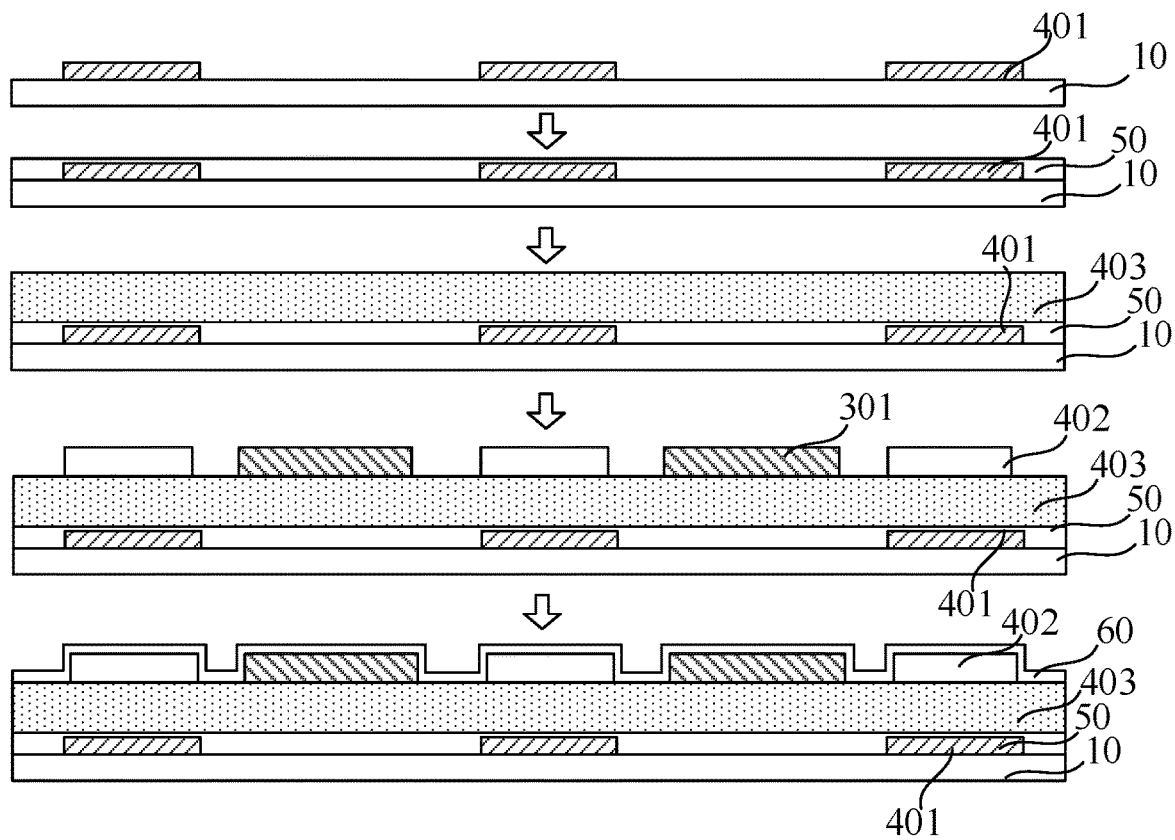
FIG. 10 is a flow diagram of a method for manufacturing a phase shifter according to an embodiment of the present disclosure.

In an embodiment of the present disclosure, as show in FIG. 10, the step of forming the one or more heat conduction structures between every two adjacent phase shifting units of at least part of the plurality of phase shifting units on a side, close to the second substrate, of the first substrate includes:

S101: forming a pattern of a first electrode on the side, close to the second substrate, of the first substrate through a patterning process;

S102: forming a thermoelectric layer on a side, facing away from the first substrate, of the first electrode;

S103: forming a pattern of a second electrode on a side, facing away from the first electrode, of the thermoelectric layer; and S104: forming the one or more heat conduction structures including the first electrode, the thermoelectric layer and the second electrode.

Figure 11:
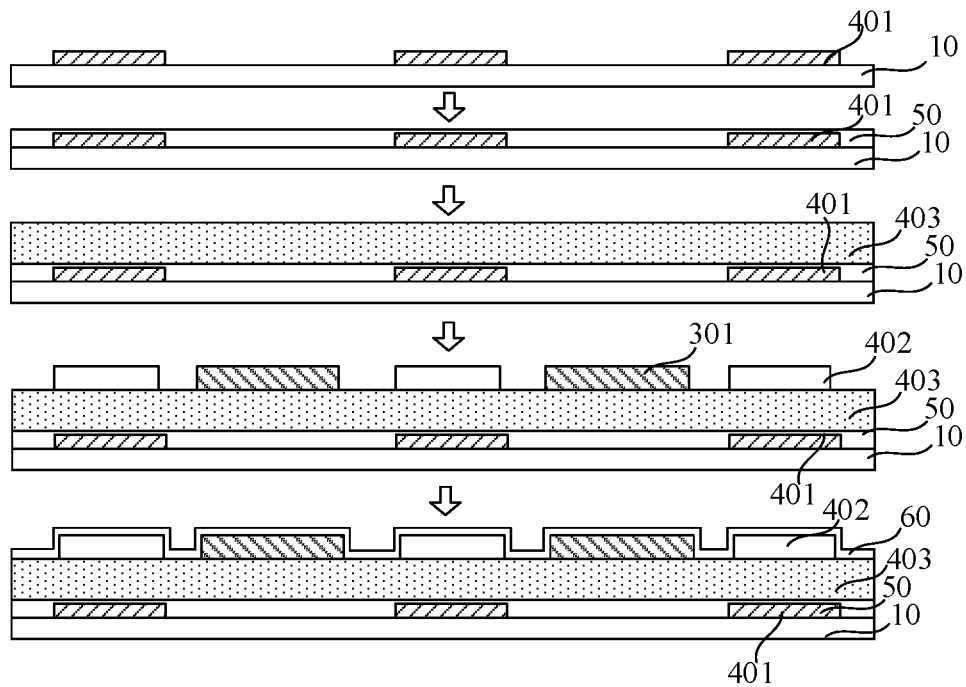
FIG. 11 is a process flow diagram corresponding to the method shown in FIG. 10.

In a specific implementation process, with the phase shifter shown in FIG. 9 as an example, and in combination with a process flow diagram shown in FIG. 11, a specific implementation process of S101-S104 is as follows.

Firstly, a Mo metal layer having a certain thickness is deposited on a side, close to the second substrate 20, of the first substrate 10 through a sputtering process, where the thickness ranges from 1000 Å-2200 Å. Then, the Mo metal layer is etched through a patterning process, to form patterns of first electrodes 401 required for heat conduction structures 40. The patterning process may be a photoetching process and an etching process, which is not limited herein. After the patterns of the first electrodes 401 are formed, SiN having a certain thickness is deposited on sides, facing away from the first substrate 10, of the first electrodes 401, to form a first passivation layer 50, where the thickness is, for example, 2000 Å. Then, the first passivation layer 50 is patterned through the photoetching process and the etching process. Then, the thermoelectric layer 403 is formed on a side, facing away from the first substrate 10, of the first passivation layer 50. For example, an organic PVDF material layer having a thickness about 10 μm may be used for coating, and then is solidified and crystallized to form the required thermoelectric layer 403. Solidification may be carried out at 100° C. for 20 min, and crystallization may be carried out in the air at 140° C. for 1 h. Then, the thermoelectric layer is patterned through the photoetching process and the etching process, and polarized in an in-situ electric field polarization device to realize a thermoelectric function thereof. Then, Cu having a thickness about 3000 Å is deposited on a side, facing away from the first substrate 10, of the thermoelectric layer 403 through a sputtering process to serve as a seed layer. Then, Cu having a thickness about 3 μm is deposited through an electroplating process. Then, Cu is patterned through the photoetching process and the etching process to form second electrodes 402 required for the heat conduction structures 40 and microstrip line electrodes 301 required for phase shifting units 30. In this way, the heat conduction structures 40 including the first electrodes 401, the thermoelectric layer 403 and the second electrodes 402 are formed on the first substrate 10. Then, SiN having a thickness of 2000 Å is deposited to form a second passivation layer 60. Then, the second passivation layer is patterned through the photoetching process and the etching process. The second passivation layer 60 may effectively prevent outside water and oxygen from eroding the second electrodes 402 and the microstrip line electrodes 301, thereby ensuring use performance of the phase shifter.

Figure 12:
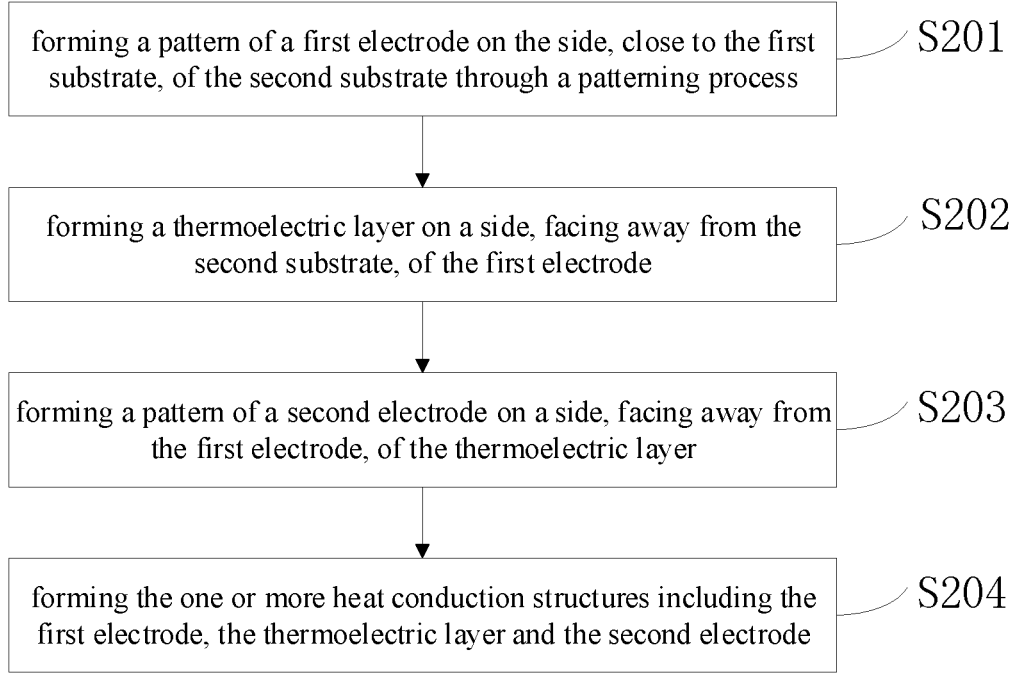
FIG. 12 is a flow diagram of a method for manufacturing a phase shifter according to an embodiment of the present disclosure.

In an embodiment of the present disclosure, as shown in FIG. 12, the step of forming the one or more heat conduction structures between every two adjacent phase shifting units of at least part of the plurality of phase shifting units on a side, close to the first substrate, of the second substrate includes:

S201: forming a pattern of a first electrode on the side, close to the first substrate, of the second substrate through a patterning process;

S202: forming a thermoelectric layer on a side, facing away from the second substrate, of the first electrode;

S203: forming a pattern of a second electrode on a side, facing away from the first electrode, of the thermoelectric layer; and S204: forming the one or more heat conduction structures including the first electrode, the thermoelectric layer and the second electrode.

Figure 13:
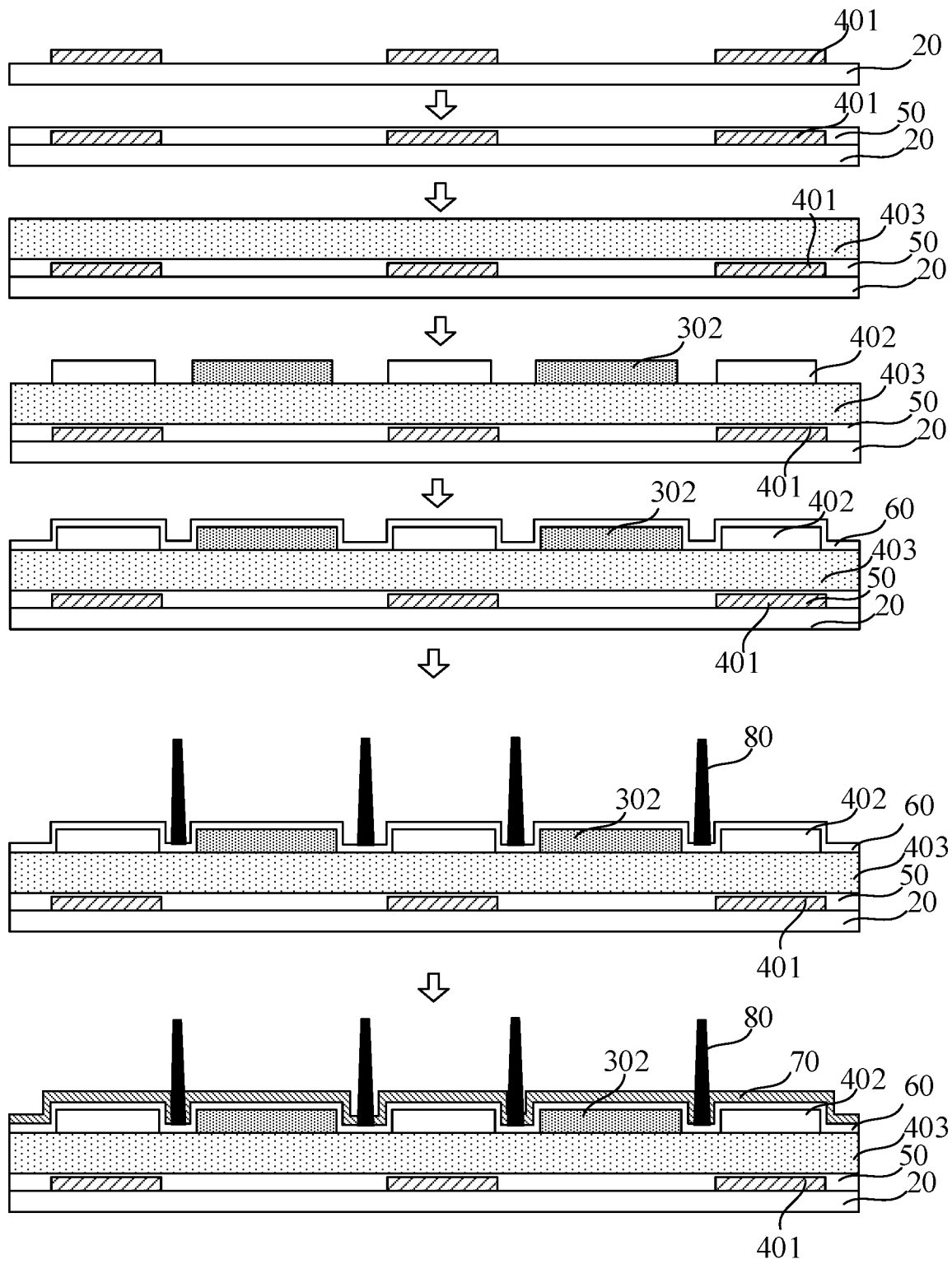
FIG. 13 is a process flow diagram corresponding to the method shown in FIG. 12.

In a specific implementation process, with the phase shifter shown in FIG. 9 as an example, and in combination with a process flow diagram shown in FIG. 13, a specific implementation process of S201-S204 is as follows.

Firstly, a Mo metal layer having a certain thickness is deposited on a side, close to the first substrate 10, of the second substrate 20 through a sputtering process, where the thickness ranges from 1000 Å-2200 Å. Then, the Mo metal layer is etched through a patterning process, to form patterns of first electrodes 401 required for heat conduction structures 40. The patterning process may be a photoetching process and an etching process, which is not limited herein. After the patterns of the first electrodes 401 are formed, SiN having a certain thickness is deposited on sides, facing away from the second substrate 20, of the first electrodes 401, to form a first passivation layer 50, where the thickness is, for example, 2000 Å. Then, the first passivation layer 50 is patterned through the photoetching process and the etching process. Then, the thermoelectric layer 403 is formed on a side, facing away from the second substrate 20, of the first passivation layer 50. For example, an organic PVDF material layer having a thickness about 10 m may be used for coating, and then is solidified and crystallized to form the required thermoelectric layer 403. Solidification may be carried out at 100° C. for 20 min, and crystallization may be carried out in the air at 140° C. for 1 h. Then, the thermoelectric layer is patterned through the photoetching process and the etching process, and polarized in an in-situ electric field polarization device to realize a thermoelectric function thereof. Then, Cu having a thickness about 3000 Å is deposited on a side, facing away from the second substrate 20, of the thermoelectric layer 403 through a sputtering process to serve as a seed layer. Then, Cu having a thickness about 3 μm is deposited through an electroplating process. Then, Cu is patterned through the photoetching process and the etching process to form second electrodes 402 required for the heat conduction structures and ground electrodes 302 required for phase shifting units 30. In this way, the heat conduction structures 40 including the first electrodes 401, the thermoelectric layer 403 and the second electrodes 402 are formed on the second substrate 20. Then, SiN having a thickness of 2000 Å is deposited to form a second passivation layer 60. Then, the second passivation layer is patterned through the photoetching process and the etching process. The second passivation layer 60 may effectively prevent outside water and oxygen from eroding the second electrodes 402 and the ground electrodes 302, thereby ensuring use performance of the phase shifter. Then, a side, facing away from the second substrate, of the second passivation layer 60 may be coated with a polystyrene (PS) material having a certain thickness, to form a supporting layer 80 for alignment between the base plate on which the first substrate 10 is located and the base plate on which the second substrate 20 is located. Then, the PS material is patterned through the photoetching process and the etching process to form the required supporting layer 80. It should be noted that a height of the supporting layer 80 is the sum of a thickness of the microstrip line electrode 301, a thickness of the ground electrode 302, and a distance between the microstrip line electrode 301 and the ground electrode 302. In this way, alignment efficiency between the base plate on which the first substrate 10 is located and the base plate on which the second substrate 20 is located is ensured, and use performance of the phase shifter is improved.

For manufacturing processes of other film layer structures in the phase shifter, reference may be made to the description of relevant portions of the above S101-S104 and S201-S204, which will not be described in detail herein.

It should be noted that after the second passivation layer 60 is manufactured on the side, close to the second substrate 20, of the first substrate 10, and after the second passivation layer 60 is manufactured on the side, close to the first substrate 10, of the second substrate 20, sides, facing away from the corresponding substrates, of the second passivation layers 60 may be coated with polyimide (PI) liquids each having a certain thickness respectively, and then are solidified to form the required alignment layers 70. Then, a frame sealant is used for coating and solidified through a frame sealing process, and a phase shifter structure is manufactured through an alignment process, a liquid crystal pouring process and a bonding process.

In a specific implementation process, the principle of solving the problem by the method for manufacturing a phase shifter is similar to that of the above phase shifter, such that for the specific structure of the phase shifter manufactured through the manufacturing method, reference may be made to implementation of the above phase shifter, and repetitions will not be described.

Although preferred embodiments of the present disclosure have been described, those skilled in the art can make additional changes and modifications to these embodiments once they learn the basic inventive concept. Therefore, the appended claims are intended to be interpreted as including preferred embodiments and all changes and modifications falling within the scope of the present disclosure.

Apparently, those skilled in the art can make various modifications and variations to the present disclosure without departing from the spirit and scope of the present disclosure. In this way, if these modifications and variations of the present disclosure fall within the scope of the claims of the present disclosure and equivalent technologies thereof, the present disclosure is also intended to include these modifications and variations.

What is claimed is:

1. A phase shifter, comprising:
    a first substrate and a second substrate that are oppositely arranged;
    a plurality of phase shifting units arranged in an array between the first substrate and the second substrate; and
    one or more heat conduction structures arranged between the first substrate and the second substrate;
    wherein orthographic projections of the one or more heat conduction structures and orthographic projections of the plurality of phase shifting units on a same substrate do not overlap each other.

2. The phase shifter according to claim 1, wherein the one or more the heat conduction structures are arranged between every two adjacent phase shifting units of at least part of the plurality of phase shifting units.

3. The phase shifter according to claim 1, wherein the one or more heat conduction structures are arranged on a side, close to the second substrate, of the first substrate; and/or,
    the one or more heat conduction structures are arranged on a side, close to the first substrate, of the second substrate.

4. The phase shifter according to claim 3, wherein the heat conduction structures comprise first electrodes, a thermoelectric layer and second electrodes that are sequentially stacked on a corresponding substrate; and
    orthographic projections of the first electrodes of the heat conduction structures on the corresponding substrate completely fall within orthographic projections of corresponding second electrodes on the corresponding substrate.

5. The phase shifter according to claim 4, wherein the plurality of phase shifting units comprise:
    a plurality of microstrip line electrodes located on the side, close to the second substrate, of the first substrate; and
    a plurality of ground electrodes located on the side, close to the first substrate, of the second substrate and corresponding to the plurality of microstrip line electrodes;
    wherein orthographic projections of the plurality of microstrip line electrodes of the plurality of phase shifting units on the first substrate do not overlap each other; and
    orthographic projections of the plurality of ground electrodes of the plurality of phase shifting units on the second substrate do not overlap each other.

6. The phase shifter according to claim 5, wherein the second electrodes and the plurality of microstrip line electrodes that are located on the first substrate are manufactured on a same layer and insulated from each other.

7. The phase shifter according to claim 5, wherein the second electrodes and the plurality of ground electrodes that are located on the second substrate are manufactured on a same layer and insulated from each other.

8. The phase shifter according to claim 4, wherein the first electrodes located on a same substrate are connected in series via a wire and are grounded.

9. The phase shifter according to claim 8, wherein the thermoelectric layer corresponding to the heat conduction structures located on a same substrate is an entire layer structure.

10. The phase shifter according to claim 5, wherein the plurality of phase shifting units further comprise dielectric layers located between the plurality of microstrip line electrodes and the plurality of ground electrodes; and
    orthographic projections of the dielectric layers of the plurality of phase shifting units on the second substrate do not overlap each other.

11. The phase shifter according to claim 10, wherein at least one supporting post is arranged between every two adjacent phase shifting units of at least part of the plurality of phase shifting units.

12. An electronic device, comprising: the phase shifter of claim 1.

13. A method for manufacturing the phase shifter of claim 1, comprising:
    forming the one or more heat conduction structures between the first substrate and the second substrate while the plurality of phase shifting units arranged in an array are formed.

14. The method according to claim 13, wherein the forming the one or more heat conduction structures between the first substrate and the second substrate comprises:
  forming the one or more heat conduction structures between every two adjacent phase shifting units of at least part of the plurality of phase shifting units.

15. The method according to claim 14, wherein the forming the one or more heat conduction structure between every two adjacent phase shifting units of at least part of the plurality of phase shifting units comprises:
  forming the one or more heat conduction structures between every two adjacent phase shifting units of at least part of the plurality of phase shifting units on a side, close to the second substrate, of the first substrate; and/or
  forming the one or more heat conduction structures between every two adjacent phase shifting units of at least part of the plurality of phase shifting units on a side, close to the first substrate, of the second substrate.

16. The method according to claim 15, wherein the forming the one or more heat conduction structures between every two adjacent phase shifting units of at least part of the plurality of phase shifting units on the side, close to the second substrate, of the first substrate comprises:
  forming a pattern of a first electrode on the side, close to the second substrate, of the first substrate through a patterning process;
  forming a thermoelectric layer on a side, facing away from the first substrate, of the first electrode;
  forming a pattern of a second electrode on a side, facing away from the first electrode, of the thermoelectric layer; and
  forming the one or more heat conduction structures comprising the first electrode, the thermoelectric layer and the second electrode.

17. The method according to claim 14, wherein the forming the one or more heat conduction structures between every two adjacent phase shifting units of at least part of the plurality of phase shifting units on the side, close to the first substrate, of the second substrate comprises:
  forming a pattern of a first electrode on the side, close to the first substrate, of the second substrate through a patterning process;
  forming a thermoelectric layer on a side, facing away from the second substrate, of the first electrode;
  forming a pattern of a second electrode on a side, facing away from the first electrode, of the thermoelectric layer; and
  forming the one or more heat conduction structures comprising the first electrode, the thermoelectric layer and the second electrode.

\* \* \* \* \*